United States Patent [19]

Nakamura

[11] 4,223,177
[45] Sep. 16, 1980

[54] STRUCTURE AND METHOD FOR SEALING ELECTRONIC PARTS

[75] Inventor: Takeshi Nakamura, Uji, Japan

[73] Assignee: Murata Manufacturing Co., Ltd., Japan

[21] Appl. No.: 928,278

[22] Filed: Jul. 26, 1978

[30] Foreign Application Priority Data

Aug. 11, 1977 [JP] Japan .......................... 52-107945[U]

[51] Int. Cl.² .............................................. H05K 5/00
[52] U.S. Cl. .................................... 174/52 S; 84/457; 174/DIG. 8; 310/344; 338/184
[58] Field of Search ................. 174/DIG. 8, 52 S, 50; 84/409, 457, DIG. 24; 58/23 TF; 310/370, 344; 338/184

[56] References Cited

U.S. PATENT DOCUMENTS

| | | | |
|---|---|---|---|
| 3,603,720 | 9/1971 | Rabie | 174/52 S |
| 3,609,623 | 9/1971 | Zdanys | 338/184 X |
| 3,697,766 | 10/1972 | Ganter | 84/457 X |
| 3,731,130 | 5/1973 | Dutta | 174/DIG. 8 |

Primary Examiner—Roy N. Envall, Jr.
Assistant Examiner—D. A. Tone
Attorney, Agent, or Firm—Ostrolenk, Faber, Gerb & Soffen

[57] ABSTRACT

A base has means for mounting and holding an electronic component, and a plurality of lead-out terminals for establishing electric connection between the electronic component and an external circuit. With the electronic component mounted on the base, an inner casing adapted to cover the electronic component is placed on the base. A tube made of a synthetic resin which will contract when heated is applied to cover the junctions between the base and the inner casing over the entire perimeter of the base. In this condition, the tube is heated to shrink it, so that the junctions are sealed by the tube. Thereafter, an outer casing the bottom of which is fixed on the base as to cover the inner casing and the contracted tube, remaining in intimate contact with the tube.

10 Claims, 7 Drawing Figures

STRUCTURE AND METHOD FOR SEALING ELECTRONIC PARTS

BACKGROUND OF THE INVENTION

1. Field of the Invention

The present invention relates to a structure and method for sealing electronic components. More particularly, it relates to a structure and method for sealing electronic components against dust and moisture.

2. Description of the Prior Art

Many electronic components must be protected from moisture and dust. An example is a piezoelectric vibrator. A sealing structure is desirable for the protection of such a piezoelectric vibrator and such a structure has heretofore been adopted. It is usual practice to use a base and a casing to form a container, with the base serving as the bottom. One method is to use a base and a casing which have the same temperature coefficient, and to bond the contact surfaces by an adhesive agent. A forced setting procedure cannot be used with this method, lest air bubbles form in the adhesive agent layer, so that this method is time-consuming and the productivity is low. Furthermore, the external appearance of the product is unappealing. Moreover, high dimensional accuracy is required positioning the casing on the base. Another method of providing a sealing structure is the so-called resin molding process, in which after the base and the casing are attached together, resin is poured in for sealing. With this method, it is necessary to wait until the resin has set, which is time-consuming, so that the productivity is low.

Furthermore, in the two methods described above, once the sealing treatment is applied, no correction in the interior of the sealing structure is possible. For example, in cases where it is necessary to replace the electronic part, as when a defect is found or when the specifications are changed, there is no alternative but to destroy the casing and base. Thus, the yield is poor.

SUMMARY OF THE INVENTION

In brief, an electronic component is mounted on a base. A thermally contractible tube is then applied to cover the entire perimeter of the base. The tube is then contracted thermally, so that it fits the perimeter of the base exactly. Thereafter, an inner casing is put on top of the base, the two being in contact along the lateral edge of the base, and the casing and the base are fixed together.

According to the present invention, the use of a thermally contractible tube enables the treatment to be performed in a short time, thus improving the efficiency of operation. Furthermore, in cases where it is necessary to re-adjust or replace the electronic component enclosed in the interior, as when a defect is found or the specifications are changed, it is only necessary to destroy the thermally contractible tube, which is relatively inexpensive, while the other casing parts can be re-used. Thus, the invention is also economically superior to the prior art.

Accordingly, a principal object of the present invention is to provide an improved method of sealing electronic components.

Another object of the invention is to provide a method of sealing electronic components which is simple and efficient and can be carried out in a short time.

Another object of the invention is to provide an improved structure for sealing electronic components.

Another object of the invention is to provide a simple structure for sealing electronic components which allows easy internal correction.

A further object of the invention is to provide an economical structure for sealing electronic components.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
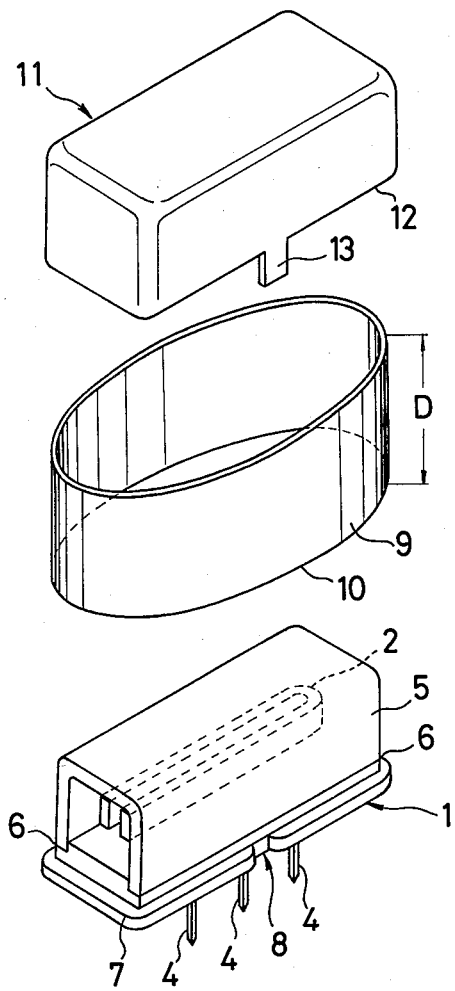
FIG. 1 is an exploded view of a structure for sealing a tuning fork type vibrator showing one embodiment of the invention.
Figure 2A:
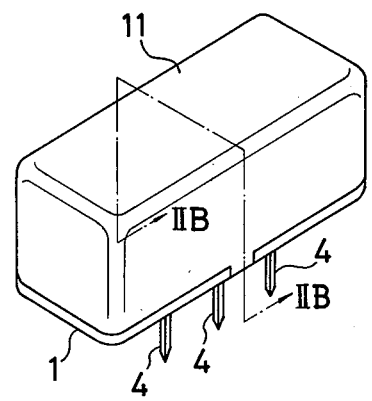
FIG. 2A is a view showing the external appearance of the completed assembly.
Figure 2B:
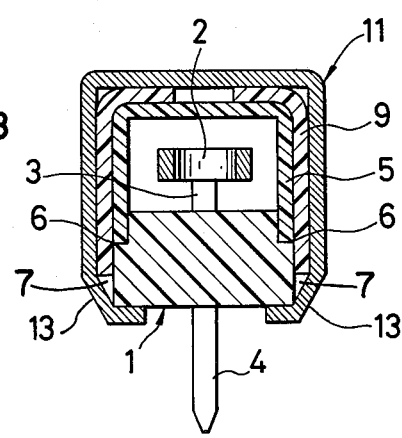
FIG. 2B is a sectional view taken along the line IIB—IIB of FIG. 2A.

A structure for sealing tuning fork type vibrators to which the invention can be particularly advantageously applied will be hereinafter described. However, the invention is not limited in its applicability to tuning fork type vibrators but can also be advantageously applied to structures for sealing other electronic parts that must be protected from moisture and dust, such as piezoelectric ceramic resonators, hybrid IC, inductance elements and fly-back transformers. Referring to FIG. 1, a base 1 is made, e.g., of synthetic resin or ceramic material. As shown in FIG. 2B, the upper surface of the base 1 is formed with a support 3 for supporting a tuning fork type vibrator 2 shown as an example of an electronic part which requires protection from moisture and dust. Set in the base 1 are a plurality of lead-out terminals 4 extending downward from the lower surface thereof. The upper ends of these terminals 4 project above the upper surface of the base 1. The terminals 4 are connected to associated electrodes (not shown) provided on the tuning fork type vibrator 2 for receiving or applying electric signals.

An inner case 5 of U-shaped cross-section made, e.g., of synthetic resin or metal is prepared. The inner case 5 is so positioned that its lower end surface and the lower portion of its inner peripheral surface engage the base 1. To this end, the lateral edge of the base 1 is recessed on its upper surface, as shown. With the inner case 5 in position, its outer surface and that of the base 1 flush with it define surfaces 6.

The inner case 5 is designed to have substantial weight so that when it is integrated with the base 1 it will substantially add to the weight of the base 1. Thus, it brings about the so-called weight effect which prevents the leakage of vibrations from the tuning type vibrator 2. The base 1 is formed with a flange 7 extending outward from the surfaces 6 formed by the base 1 and the inner case 5 and from the end surfaces of the base 1 and a portion (substantially at the middle of the length) of each of the long sides of the flange is formed with a recess or notch 8).

With the base 1 supporting the tuning fork type vibrator 2 by the support means 3 and having the inner case 5 mounted on it, a thermally contractible tube 9 cut to a predetermined size is placed on the base 1 to surround the inner case 5. The width of length D of the tube 9 is such that it extends upward to cover at least the junctions 6 between the base 1 and the inner case 5. The tube 9 is applied so that its lower end edge 10 abuts against the upper surface of the flange 7 formed on the case 1. The thermally contractible tube 9 is then contracted by being heated by means of a hot gun, a drying furnace or other suitable means. Therefore, the tube 9 is everywhere in intimate contact with the contours of the inner case 5 and the surfaces 6 formed by the inner case 5 and the base 1. Since the contracting process of the tube 9 is carried out almost in seconds, the efficiency of the operation is high. Furthermore, the atmosphere enclosed in the inner case 5 together with the tuning fork type vibrator 2 is also dried by the heating.

An outer case 11 is prepared which is made of such a metal material as copper or copper alloy, aluminum or aluminum alloy, or iron or iron alloy. The bottom of the outer case 11 is open while its top and sides are closed. The bottom edge 12 of the outer case 11 is formed with two downward extending tabs 13 (only one of which is shown in FIG. 1). The positions of the tabs 13 correspond to the positions of the notches 8 of the base 1 described above. The inside dimensions of the outer case 11 are selected so that the outer case 11 fits snugly over the base 1 and the tube 9. By putting the bottom edge 12 of the outer case in contact with the flange 7 of the base 1 and bending the tabs 13 of the outer case 11 through the notches 8 and under the base 1, the sealed structure shown in FIG. 2A is obtained.

Whereas in the prior art the resonance of the outer case can coact with the tuning fork type vibrator with adverse effects on the spurious characteristics of the device, according to the present invention the tube 9 can act as a buffer, and therefore it is possible to eliminate the adverse effects of the outer case 11 on the tuning fork type vibrator 2. Furthermore, in the past, there has been used an arrangement in which a thermally contractible tube is applied to the outer case to cover the outer surface thereof. In contrast thereto, according to the embodiment of the present invention described above, the tube 9 is concealed within the outer case 11 and cannot spoil the external appearance. Furthermore, the metal of which the outer case 11 is made will give the user an impression that the product is of high quality. Furthermore, there is no possibility of damaging the seal by scratching the component or because of heat from soldering done when the component is mounted on a printed circuit board, which has been a problem with the conventional design in which the thermally contractible tube is applied to the outer surface of the outer case.

Figure 3:
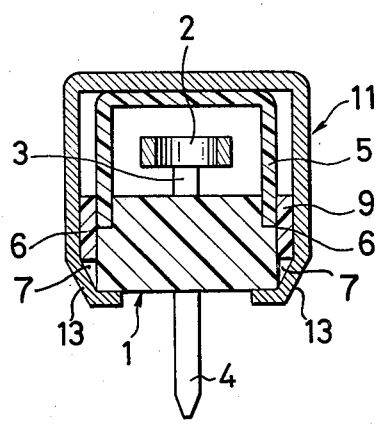
FIGS. 3 through 6 are sectional views similar to FIG. 2B, showing different structures for sealing a tuning fork type vibrator according to other embodiments of the invention.

FIG. 3 is a sectional view similar to FIG. 2B, showing the sealed device after assembly according to another embodiment of the invention. In this embodiment, the height D of the thermally contractible tube 9 is reduced as compared with the embodiment shown in FIGS. 1, 2A and 2B. The thermally contractible tube 9 covers only the vicinity of the point at which the base 1 supports the inner case 5. With this arrangement, less material need be used for the tube 9, without the sealing effect being lessened.

Figure 4:
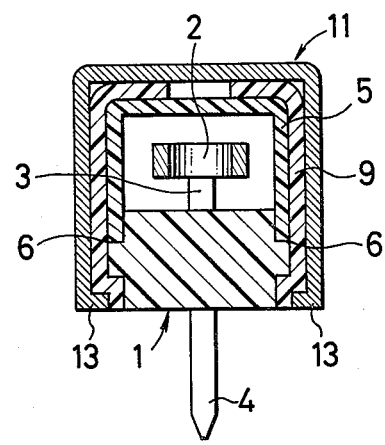

FIG. 4 is a sectional view similar to FIG. 2B, showing the sealed device after assembly according to a further embodiment of the invention. This embodiment is different from the foregoing embodiments in the shape of the lateral edge of the base 1. The thermally contractible tube 9 is applied so as to completely cover the lateral edge of the base 1.

Figure 5:
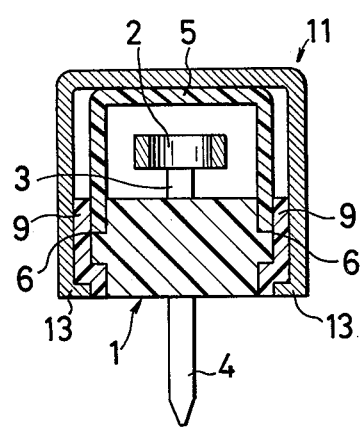

FIG. 5 is a sectional view similar to FIG. 2B, showing the sealed device after assembly according to another embodiment of the invention. This embodiment is the same as that shown in FIG. 4, except that the height of the thermally contractible tube 9 is reduced. The thermally contractible tube 9 covers only the vicinity of the point at which the base 1 and the inner case 5 meet. With this arrangement, the material of the thermally contractible tube 9 can be saved, as in the embodiment shown in FIG. 3.

Figure 6:
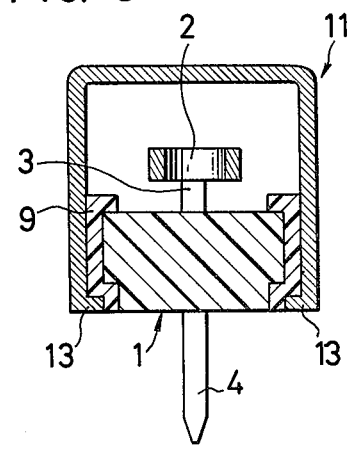

FIG. 6 is a sectional view similar to FIG. 2B, showing the sealed device after assembly according to yet another embodiment of the invention. This embodiment is characterized in that the inner case 5 (described in the foregoing embodiments) is removed. The thermally contractible tube 9 is applied to the base 1 to cover its entire perimeter and then contracted. The outer case 11 is then attached to the base 1 over the tube 9 which is in intimate contact with the sides and ends of the base 1.

In addition, the thermally contractible tube 9 used in the present invention may be made, e.g., of vinyl resins or olefin resins. The upper end of the tube 9 is accommodated in the outer case 11, but the lower end may extend downward beyond the junction between the outer case 11 and the base 1.

Although the present invention has been described and illustrated in connection with several preferred embodiments, many modifications and variations thereof will now be apparent to one skilled in the art, and the spirit and scope of the present invention are limited not by the details of the particular embodiments herein described but only by the terms of the appended claims.

What is claimed is:

1. A sealed housing for an electronic component, comprising:
    a base having a recessed shoulder around at least part of its perimeter;
    external connection terminals which extend from said base and which can be connected to an electronic component for electrically connecting an electronic component to an external circuit;
    an inner casing set on said recessed shoulder of said base;
    a tube formed of a material that shrinks upon being heated, disposed at and snugly covering the junction between said base and said inner casing, said tube having been shrunk to fit tightly over said base and said inner casing; and
    an outer casing fitting tightly over the combination of said inner casing, said base and said tube.

2. The sealed housing of claim 1, wherein said tube is made of a synthetic resin that shrinks upon being heated.

3. The sealed housing of claim 2, wherein said tube is received on a flange portion of said base.

4. The sealed housing of claim 1, wherein said junction of said base and said inner casing is substantially flush.

5. The sealed housing of claim 14, wherein said tube is in contact with all of said substantially flush junction and is disposed between said substantially flush junction and said outer casing.

6. The sealed housing of claim 5, wherein said tube covers substantially all of the lateral surface of said inner casing.

7. The sealed housing of claim 1, wherein said inner casing has a substantially U-shaped cross-section and is open at each end.

8. A method for sealing an electronic component, comprising the steps of:

fixing an electronic component to a base having a recessed shoulder around at least a part of its perimeter and having a lateral surface extending around its entire perimeter, and having external connection leads extending from it;

connecting said electronic component to said external connection leads;

fitting an inner casing over the combination of said base and said electrical component, said inner casing being received on said recessed shoulder of said base to form a substantially flush junction therewith;

fitting over the combination of said base, said electronic component and said inner casing a tube made of a synthetic resin that shrinks upon being heated, said tube, when in place, covering all of said lateral surface of said base and covering said substantially flush junction;

heating said tube to shrink it so that it fits tightly around said lateral surface of said base; and fitting tightly over the combination of said base, said electronic component and said tube an outer casing so that said tube is disposed between said base and said outer casing, and so that said electronic component is hermetically sealed within said outer casing.

9. The method of claim 8, wherein said step of heating said tube further comprises the step of placing said base, said electronic component and said tube in a high-temperature drying furnace.

10. The method of claim 8, wherein said step of heating said tube further comprises the step of putting said tube into contact with a hot gun.

* * * * *